(12) United States Patent
Liu et al.

(10) Patent No.: US 7,307,278 B2
(45) Date of Patent: Dec. 11, 2007

(54) ORGANIC ELECTRONIC DEVICES HAVING TWO DIMENSIONAL SERIES INTERCONNECTIONS

(75) Inventors: Jie Liu, Niskayuna, NY (US); Anil Raj Duggal, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 37 days.

(21) Appl. No.: 11/021,265

(22) Filed: Dec. 22, 2004

(65) Prior Publication Data

US 2006/0131566 A1 Jun. 22, 2006

(51) Int. Cl.
*H01L 35/24* (2006.01)
*H01L 51/00* (2006.01)
*H01L 33/00* (2006.01)

(52) U.S. Cl. ............................. 257/40; 257/88; 257/91
(58) Field of Classification Search ................ 257/40, 257/88, 91, 99
See application file for complete search history.

(56) References Cited

U.S. PATENT DOCUMENTS

| | | | | | |
|---|---|---|---|---|---|
| 4,268,843 | A | * | 5/1981 | Brown et al. ................. | 257/82 |
| 6,023,073 | A | * | 2/2000 | Strite ........................... | 257/40 |
| 6,693,296 | B1 | * | 2/2004 | Tyan ............................ | 257/40 |
| 6,800,999 | B1 | * | 10/2004 | Duggal et al. ........... | 315/169.1 |
| 7,034,470 | B2 | * | 4/2006 | Cok et al. ................... | 315/249 |
| 2004/0021425 | A1 | | 2/2004 | Foust et al. .............. | 315/169.3 |

FOREIGN PATENT DOCUMENTS

WO WO 02/078101 10/2002

OTHER PUBLICATIONS

Bernards et al.; "Cascaded light-emitting devices based on a ruthenium complex"; Appl. Phys. Lett., vol. 84, No. 24, Jun. 14, 2004; pp. 4980-4982.
Liao, Klubek, and Tang; "High-efficiency tandem organic light-emitting diodes"; Appl. Phys. Lett., vol. 84, No. 2, Jan. 12, 2004; pp. 167-169.

* cited by examiner

*Primary Examiner*—Shouxiang Hu
(74) *Attorney, Agent, or Firm*—Fletcher Yoder

(57) ABSTRACT

A device includes a plurality of organic electronic devices disposed on a substrate, wherein each of the plurality of organic electronic devices comprises a first electrode and a second electrode, and wherein each of the plurality of organic electronic devices is electrically coupled in series. Further, the device includes an electro-active material disposed between the first and second electrodes of each of the plurality of organic electronic devices. In addition, the device includes an interconnect layer disposed on the substrate, wherein the interconnect layer is configured to electrically couple each of the plurality of organic electronic devices in series via coupling the respective first and second electrodes of each of the plurality of organic electronic devices.

14 Claims, 4 Drawing Sheets

ORGANIC ELECTRONIC DEVICES HAVING TWO DIMENSIONAL SERIES INTERCONNECTIONS

STATEMENT REGARDING FEDERALLY SPONSORED RESEARCH & DEVELOPMENT

This invention was made with Government support under contract number 70NANB3H3030 awarded by National Institute of Standards and Technology. The Government has certain rights in the invention.

BACKGROUND

The invention relates generally to electronic devices, and more particularly to organic electronic devices.

In recent years, organic electronic devices, such as, but not limited to, organic light emitting devices, organic photovoltaic cells, organic electrochromic devices, organic transistors, organic integrated circuits, or organic sensors, have attracted much attention due to low cost and compatibility with flexible plastic substrates.

Currently, organic electronic devices, such as, but not limited to, organic light emitting devices, are being increasingly employed for applications, such as display applications, for example, flat panel displays and area lighting applications. In the last decade, tremendous progress has been made in the area of organic electronic devices. Previously, liquid crystal displays (LCDs) were employed for most display applications. However, the fabrication of LCD displays often involves high production and commercial expenses.

With the imaging appliance revolution underway, the need for more advanced handheld devices that combine the attributes of a computer, personal digital assistant (PDA), and cell phone is increasing. In addition, the need for new lightweight, low power, wide viewing angle devices have fueled an emerging interest in developing flat panel displays while circumventing high production and commercial expenses associated with liquid crystal displays. Consequently, the flat panel display industry is looking to employ new displays utilizing devices from other technologies such as organic light emitting devices.

As will be appreciated by one skilled in the art, an organic light emitting device, such as an organic light emitting diode (OLED) includes a stack of thin organic layers sandwiched between two charged electrodes. The organic layers include a hole injection layer, a hole transport layer, an emissive layer, and an electron transport layer. Upon application of an appropriate voltage to the OLED, typically between 2 and 10 volts, the injected positive and negative charges recombine in the emissive layer to produce light. Further, the structure of the organic layers and the choice of materials for use as the anode and cathode are chosen to maximize the recombination process in the emissive layer, thus maximizing the light output from the OLED device. This structure eliminates the need for bulky and environmentally undesirable mercury lamps and yields a thinner, more versatile and more compact display. In addition, the OLEDs advantageously consume minimal power. This combination of features enables OLED displays to advantageously communicate more information in a more engaging way while adding less weight and taking up less space.

Applications, such as lighting and large area signage, may necessitate use of large area organic electronic devices. Typically, large area organic electronic devices include electrically coupling a plurality of individual organic electronic devices in series on a single substrate or a combination of substrates with multiple individual organic electronic devices on each substrate. However, the series electrical coupling between the plurality of organic electronic devices is typically achieved by formation of vias configured to provide desirable interconnection.

As will be appreciated, the selective patterning of the vias and the deposition of the conducting material may generate debris that may cause defects. Further, these fabrication techniques require additional processing steps to either selectively remove organic materials or selectively apply organic materials. Additionally, the formation of interconnections through the vias necessitates the precise alignment between layers of the organic electronic device. It becomes increasingly difficult to achieve the desired precision of alignment when the size of the vias and the feature size of the components of the organic electronic devices are reduced.

It may therefore be desirable to develop a technique to electrically couple a plurality of organic electronic devices in series to facilitate the formation of large area devices that advantageously circumvents the limitations of current techniques.

BRIEF DESCRIPTION

Briefly, in accordance with aspects of the present technique, a device is presented. The device includes a plurality of organic electronic devices disposed on a substrate, wherein each of the plurality of organic electronic devices comprises a first electrode and a second electrode, and wherein each of the plurality of organic electronic devices is electrically coupled in series. Further, the device includes an electro-active material disposed between the first and second electrodes of each of the plurality of organic electronic devices. In addition, the device includes an interconnect layer disposed on the substrate, wherein the interconnect layer is configured to electrically couple each of the plurality of organic electronic devices in series via coupling one of the respective first and second electrodes of each of the plurality of organic electronic devices to one another.

According to further aspects of the present technique, a device is presented. The device includes a substrate. The device also includes a plurality of organic electronic devices, wherein each of the organic electronic devices comprises an anode and a cathode, and wherein each of the plurality of organic electronic devices is electrically coupled in series. Additionally, the device includes an electro-active material having a first side and a second side disposed between the anode and cathode of each of the plurality of organic electronic devices. Further, the device includes an interconnect layer disposed on the substrate, wherein the interconnect layer is configured to electrically couple in series a first organic electronic device and a second organic electronic device via electrically coupling an anode of the first organic electronic device and a cathode of the second organic electronic device disposed adjacent to each other, wherein the respective electrodes coupled in series are disposed on the first side of the electro-active material.

In accordance with yet another aspect of the present technique, a device is presented. The device includes a substrate. In addition, the device includes a plurality of organic electronic devices, wherein each of the organic electronic devices comprises an anode, a cathode and a third electrode, wherein the third electrode is disposed between the anode and cathode, and wherein each of the plurality of organic electronic devices are electrically coupled in series.

The device also includes at least one electro-active material disposed between each of an area between the anode and third electrode and the cathode and third electrode of each of the plurality of organic electronic devices. Additionally, the device includes a interconnect layer disposed on the substrate, wherein the interconnect layer is configured to electrically couple in series a first organic electronic device and a second organic electronic device via electrically coupling an anode of the first organic electronic device and a cathode of the second organic electronic device disposed adjacent to each other, wherein the respective electrodes coupled in series are disposed on the first side of the electro- active material.

According to aspects of the present technique, an interconnect structure is presented. The interconnect structure includes a first conductive layer. Further, the interconnect structure includes an organic layer disposed on the first conductive layer. The interconnect structure also includes a second conductive layer. In addition, an organic layer is disposed on the second conductive layer. Furthermore, the interconnect structure includes an interconnect layer disposed on the first and second conductive layers, wherein the interconnect layer is configured to electrically couple the first and second conductive layers.

According to aspects of the present technique, a method of fabricating a device is presented. The method includes disposing a first interconnect layer on a first substrate. Further, the method includes disposing a plurality of first electrodes and second electrodes on the first interconnect layer. In addition, the method includes disposing a first electro-active material on the plurality of first and second electrodes. The method further includes disposing a second interconnect layer on a second substrate. Additionally, the method includes disposing a plurality of second electrodes and first electrodes on the second conductive material. The method includes disposing a second electro-active material on the plurality of second and first electrodes. Furthermore, the method includes coupling the first and second substrates to form an assembly. The method also includes curing the assembly.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Large area lighting applications call for large area organic electronic devices. Accordingly, the formation of large area organic electronic devices includes electrically coupling a plurality of organic electronic devices, such as OLEDs. Typically, the electrical interconnection between the plurality of organic electronic devices is accomplished by patterning vias and then depositing a conducting material through the vias such that they form electrical connections between the plurality of organic electronic devices. However, formation of the vias and the deposition of the conducting material may generate debris that may cause defects. Further, a precise alignment of the plurality of organic electronic devices may be necessary to effect desirable interconnection through the vias. The techniques discussed herein address some or all of these issues.

Figure 1:
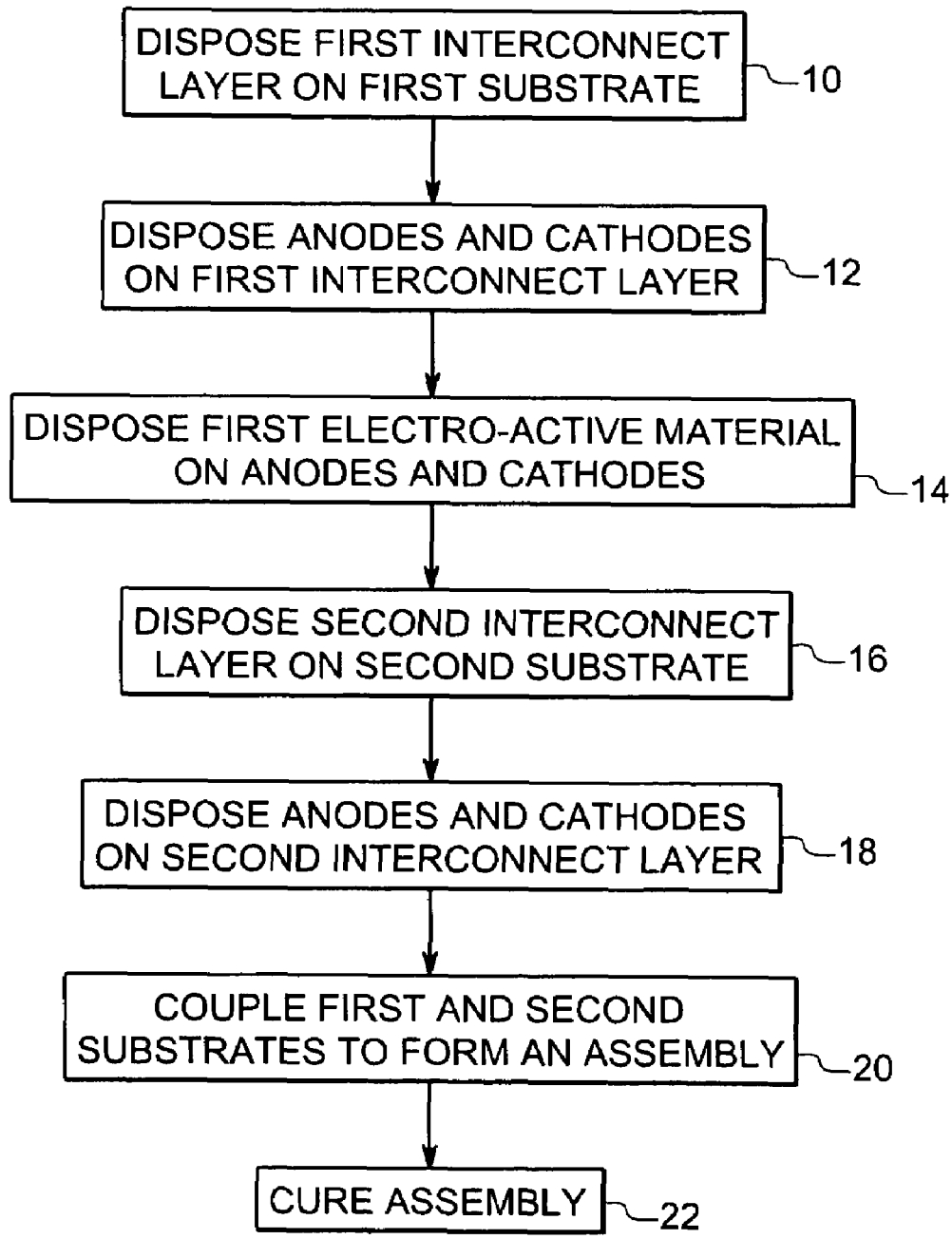
FIG. 1 illustrates a flow chart depicting a method of fabricating a device, according to aspects of the present technique.

FIG. 1 is a flow chart illustrating an exemplary method for fabricating a device, in accordance with aspects of the present technique. The device may include a plurality of organic electronic devices, where each of the plurality of organic electronic devices includes a respective first electrode and a second electrode. In one embodiment of the present technique, the electronic device may include at least a first organic electronic device and a second organic electronic device, where each of the first and second organic electronic devices includes a respective first electrode and a second electrode. According to aspects of the present technique, in one embodiment, each of the first electrodes of the first and second organic electronic devices may include an anode. Further, each of the second electrodes of the first and second organic electronic devices may include a cathode. Additionally, in an alternate embodiment, each of the first electrodes of the first and second organic electronic devices may include a charge transport layer. Also, each of the second electrodes of the first and second organic electronic devices may include a charge transport layer. Furthermore, each of the plurality of organic electronic devices may include one of an organic light emitting device, an organic photovoltaic cell, an organic electrochromic device or an organic sensor.

The method of fabricating a device summarized in FIG. 1 begins at step 10. In step 10, a first substrate may be provided. Additionally, a first interconnect layer may be disposed on the first substrate. In one embodiment, the first substrate may include a flexible substrate. The flexible substrate is generally thin, having a thickness in a range from about 0.25 mils to about 50.0 mils, and preferably in a range from about 0.5 mils to about 10.0 mils. The term "flexible" generally means being capable of being bent into a shape having a radius of curvature of less than approximately 100 cm. In another embodiment, the first substrate may include a non-flexible substrate.

The flexible substrate may be dispensed from a roll, for example. Advantageously, implementing a roll of transparent film for the flexible substrate enables the use of high-volume, low cost, reel-to-reel processing and fabrication of the organic electronic device. The roll of transparent film may have a width of 1 foot, for example, on which a number of organic packages may be fabricated and excised. The flexible substrate may comprise a single layer or may comprise a structure having a plurality of adjacent layers of different materials. The flexible substrate generally comprises any flexibly suitable polymeric material. For instance, the flexible substrate may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), and polyethylene naphtalate (PEN). Alternatively, the flexible substrate may comprise one of a metal foil, or a polymeric material with a conductive coating. Typically, the conductive coating may include a metal, a conductive ceramic, a conductive organic material, or combinations thereof Alternatively, the first substrate may include a rigid substrate, where the rigid substrate may include one of a glass, silicon, or combinations thereof.

Also, the first interconnect layer may include one of a conducting ceramic, such as ITO, a metal, such as Aluminum (Al), conductive organics, such as conducting polymers, or combinations thereof The first interconnect layer may be configured to electrically couple the plurality of organic electronic devices that are disposed adjacent to each other. In a presently contemplated configuration, the first interconnect layer may be configured to provide a series connection between organic electronic devices by coupling the electrodes of adjacently disposed organic electronic devices and will be described in greater detail hereinafter.

At step 12, a plurality of first electrodes and second electrodes of the plurality of organic electronic devices may be patterned on the first interconnect layer. In one embodiment, each of the plurality of first electrodes may include an anode. Furthermore, each of the plurality of second electrodes may include a cathode.

Each of the first electrodes of the plurality of organic electronic devices may be formed employing a first conducting material that is transparent to light emitted by the device. For example, the first electrodes may be formed employing indium tin oxide (ITO). In certain embodiments, each of the first electrodes of the plurality of organic electronic devices may be formed employing the first conducting material, where the first conducting material is transparent to light absorbed by the device. Additionally, in certain other embodiments, each of the first electrodes of the plurality of organic electronic devices may be formed employing the first conducting material, where the first conducting material is transparent to light modulated by the device. Also, each of the first electrodes of the plurality of organic electronic devices may be formed employing transparent conductors.

Furthermore, each of the plurality of second electrodes may be formed employing a second conducting material that is transparent to light emitted by the device. For example, the second conducting material may include ITO. In yet another embodiment, each of the plurality of second electrodes may include the second conducting material, where the second conducting material is transparent to the light absorbed by the device. As previously described with reference to each of the plurality of first electrodes, in certain other embodiments, each of the plurality of second electrodes may include the second conducting material, where the second conducting material is transparent to the light modulated by the device. Also, each of the second electrodes of the plurality of organic electronic devices may be formed employing transparent conductors. Additionally, each of the second electrodes of the plurality of organic electronic devices may be formed employing a metal, such as, but not limited to, Aluminum (Al).

In another embodiment, each of the plurality of first electrodes may include a hole injection layer. The plurality of first electrodes may be formed employing a conductive polymer. Furthermore, each of the plurality of second electrodes may include an electron injection layer.

Subsequently, at step 14, a layer of first electro-active material may be disposed on the plurality of first and second electrodes. The first electro-active material may be configured to serve as an intermediate layer between the respective first and second electrodes of each of the plurality of organic electronic devices. Further, the first electro-active material may include one of an organic light emitting material, an organic light absorbing material, an organic electrochromophore, or combinations thereof.

In step 16, a second substrate may be provided. Additionally, a second interconnect layer may be disposed on the second substrate. As previously described, in one embodiment, the second substrate may include a flexible substrate. Alternatively, the second substrate may include one of a glass, silicon, or combinations thereof. Also, the second interconnect layer may include one of a conductive ceramic, such as, ITO, a metal, such as Al, conductive organics, such as conducting polymers, or combinations thereof The second interconnect layer may be configured to electrically couple organic electronic devices that are disposed adjacent to each other. As previously mentioned, the second interconnect layer may be configured to provide a series connection via coupling the electrodes of adjacently disposed organic electronic devices.

Following step 16, a plurality of first and second electrodes may be disposed on the second interconnect layer in step 18. Further, in step 20 the first and the second substrates may be coupled to form an assembly. The first and second substrates may be disposed such that the respective electrodes of each of the plurality of organic electronic devices are substantially above each other. For example, the first and second substrates may be disposed such that a second electrode of a first organic electronic device is disposed substantially above a first electrode of a first organic electronic device.

Subsequently, at step 22, the assembly may be cured to form the device, according to further aspects of the present technique. In one embodiment, the assembly may be cured via heating the assembly. Alternatively, the assembly may be cured by exposing the assembly to ultra-violet radiation. Furthermore, the assembly may be cured via application of pressure. As will be appreciated by one skilled in the art, if the interconnect layer employed is formed using a thermoset material, the interconnect layer may be cured only once. However, if the interconnect layer is formed employing thermoplastic material, the interconnect layer may be reset and recured.

The device that may be formed employing the method described hereinabove may include a plurality of organic electronic devices that may be coupled in series. The device may include at least a first organic electronic device and a second organic electronic device having respective first and second electrodes, where the first and second organic electronic devices may be disposed adjacent to each other. The adjacently disposed organic electronic devices may be electrically coupled in series by coupling the first electrode of the first organic electronic device with the second electrode of the second organic electronic device via the interconnect layer. In addition, the electrodes that are coupled in series are disposed on the same side of the electro-active material.

Consequently, series interconnection between adjacently disposed organic electronic devices may be achieved without the formation of vias.

Figure 2:
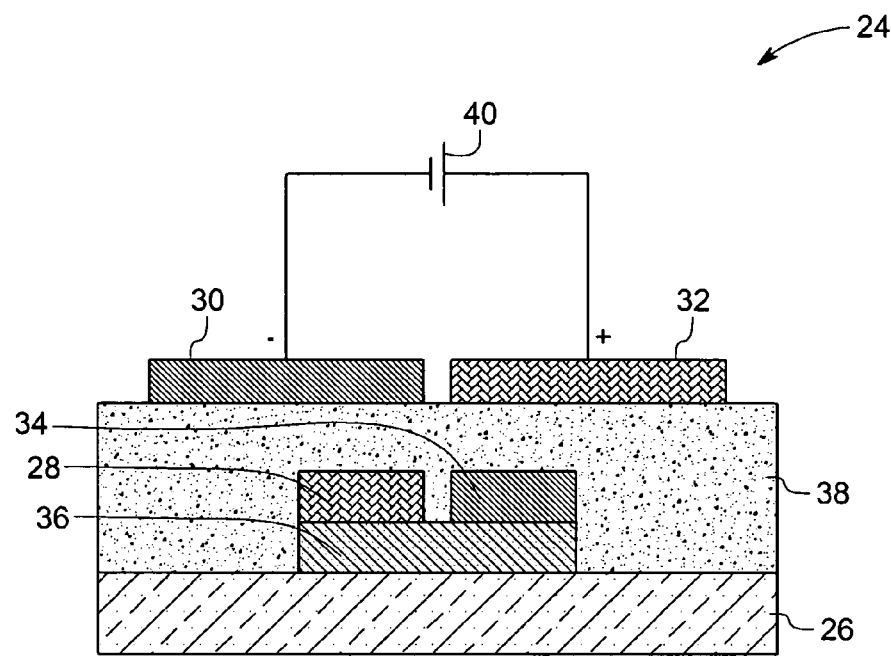
FIG. 2 illustrates a cross-sectional side view of an exemplary embodiment of a device, according to aspects of the present technique.

Turning to FIG. 2, a cross-sectional side view of a first exemplary embodiment 24 of a device is illustrated. In a presently contemplated configuration, the electronic device 24 is illustrated diagrammatically as including a substrate 26. According to one embodiment, the substrate 26 may include a flexible substrate, as previously described. Alternatively, the substrate 26 may include a non-flexible substrate, such as silicon, glass, or a flexible material, such as polyimide, although other types of materials with similar properties may be used.

In the illustrated embodiment, the device 24 is depicted as having first and second organic electronic devices. The first organic electronic device may include a first electrode 28 and a second electrode 30. In addition, the second organic electronic device may include a first electrode 32 and a second electrode 34. In a presently contemplated configuration, the first electrode 28 of the first organic electronic device is an anode and the second electrode 30 of the first organic electronic device is a cathode. Similarly, the first electrode 32 of the second organic electronic device is an anode and the second electrode 34 of the second organic electronic device is a cathode.

A first interconnect layer 36 may be disposed on the first substrate 26. The first interconnect layer 36 may include one of a conductive ceramic, such as ITO, a metal, such as Al, conductive organics, such as conducting polymers, or combinations thereof. Furthermore, the first interconnect layer may be configured to electrically couple the first and second organic electronic devices that are disposed adjacent to each other. In a presently contemplated configuration, the first interconnect layer 36 is configured to provide a series connection via coupling the anode 28 of the first organic electronic device with the cathode 34 of the second organic electronic device, where the first and second organic electronic devices are disposed adjacent to each other. In other words, the anode 28 of the first organic electronic device is coupled in series with the cathode 34 of the second organic electronic device.

With continuing reference to FIG. 2, an electro-active material 38 may be disposed between the anode and cathode of each of the plurality of the organic electronic devices. As previously mentioned, the electro-active material 38 may be configured to serve as an intermediate layer in the device 24. Further, the electro-active material may include one of an organic light emitting material, an organic light absorbing material, an organic electrochromophore, or combinations thereof In addition, the device 24 may include a power source 40 that may be configured to provide voltage to the device 24. Further, the power source 40 may be coupled to the device 24 by coupling a positive lead and a negative lead of the power source 40 to electrodes that are not coupled in series. In the illustrated embodiment of FIG. 2, the anode 32 of the second organic electronic device may be coupled to the positive lead of the of the power source 40 and the cathode 30 of the first organic electronic device may be coupled to the negative lead of the power source 40.

Therefore, in the exemplary embodiment 24 of the device illustrated in FIG. 2, it may be noted that two organic electronic devices that are disposed adjacent to each other are electrically coupled in series. The series coupling between the two adjacently disposed organic electronic devices is accomplished via the first interconnect layer 36, which is configured to facilitate coupling in series the anode 28 of the first organic electronic device with the cathode 34 of the second organic electronic device. Furthermore, the electrodes that are coupled in series are disposed on the same side of the electro-active material 38. Consequently, the series coupling is achieved in the plane of the substrate 26 and not through the electro-active material 38. As a result, either forming of vias or application of anisotropic conductive materials may not be necessary. The illustrated embodiment may be advantageously configured to exhibit desirable tolerance against misalignment, as precise alignment of the electrodes may not be required.

In addition, the electrodes that are not coupled in series may have different electrical potential from the electrodes that are coupled in series when the device is operating. In other words, the anode 28 of the first organic electronic device and the cathode 34 of the second organic electronic device that are coupled in series and disposed on a first side of the electro-active material 38 have different electrical potential from the cathode 30 of the first organic electronic device and the anode 32 of the second organic electronic device that are not coupled in series and disposed on a second side of the electro-active material 38 when the device is operating.

Figure 3:
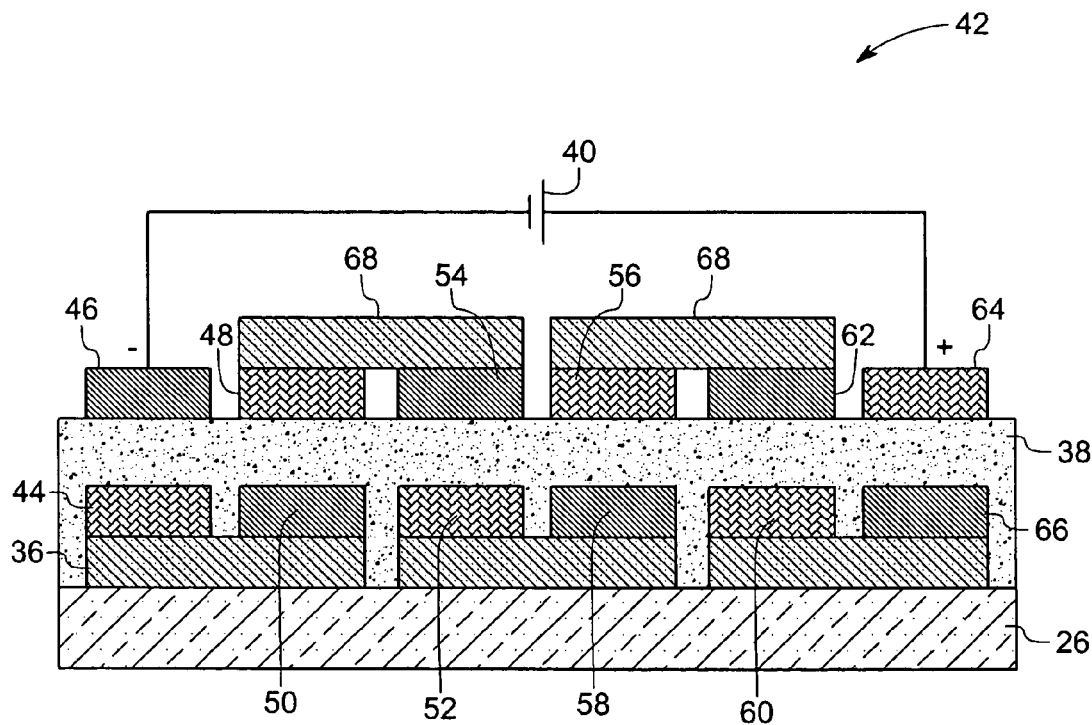
FIG. 3 illustrates a cross-sectional side view of another exemplary embodiment of a device, according to aspects of the present technique.

FIG. 3 illustrates an exemplary embodiment 42 of a device that includes six organic electronic devices that are electrically coupled in series. A first organic electronic device may include an anode 44 and a cathode 46. Similarly, a second organic electronic device may include an anode 48 and a cathode 50. Reference numerals 52 and 54 represent an anode and a cathode respectively of a third organic electronic device. Further, the fourth organic electronic device may include an anode 56 and a cathode 58. In addition, reference numerals 60 and 62 represent an anode and a cathode respectively of a fifth organic electronic device. A sixth organic electronic device may include an anode 64 and a cathode 66. Furthermore, the illustrated embodiment 42 may also include a first interconnect layer 36 and a second interconnect layer 68.

In one embodiment, the first and second interconnect layers 36, 68 may be formed using a first material. As previously described, the first material may include one of a conductive polymer, a metal, a conductive organic material or combinations thereof. Alternatively, the second interconnect layer 68 may be formed employing a second material, where the second material is different from the first material.

In the illustrated embodiment 42, series connection between the first and second organic electronic devices may be achieved by electrically coupling the anode 44 of the first organic electronic device and the cathode 50 of the second organic electronic device in series via the first interconnect layer 36. In a similar fashion, the second and third organic electronic devices may be electrically coupled by connecting the anode 48 of the second organic electronic device and the cathode 54 of the third organic electronic device in series via the second interconnect layer 68.

Further, series connection between the third and fourth organic electronic devices may be achieved by electrically coupling the anode 52 of the third organic electronic device and the cathode 58 of the fourth organic electronic device in series via the first interconnect layer 36. Similarly, the fourth and fifth organic electronic devices may be electrically coupled by connecting the anode 56 of the fourth organic electronic device and the cathode 62 of the fifth organic electronic device in series via the second interconnect layer 68.

In addition, series connection between the fifth and sixth organic electronic devices may be achieved by electrically coupling the anode 60 of the fifth organic electronic device and the cathode 66 of the sixth organic electronic device in series via the first interconnect layer 36. Further, the power source 40 may be coupled to the device 42 by coupling a positive lead and a negative lead of the power source 40 to electrodes that are not coupled in series. In the illustrated embodiment of FIG. 3, the anode 64 of the sixth organic electronic device may be coupled to the positive lead of the of the power source 40 and the cathode 46 of the first organic electronic device may be coupled to the negative lead of the power source 40. As previously mentioned, the electrodes that are coupled in series are disposed on the same side of the electro-active material 38, thereby facilitating series connection between a plurality of organic electronic devices in the plane of the substrate 26.

Figure 4:
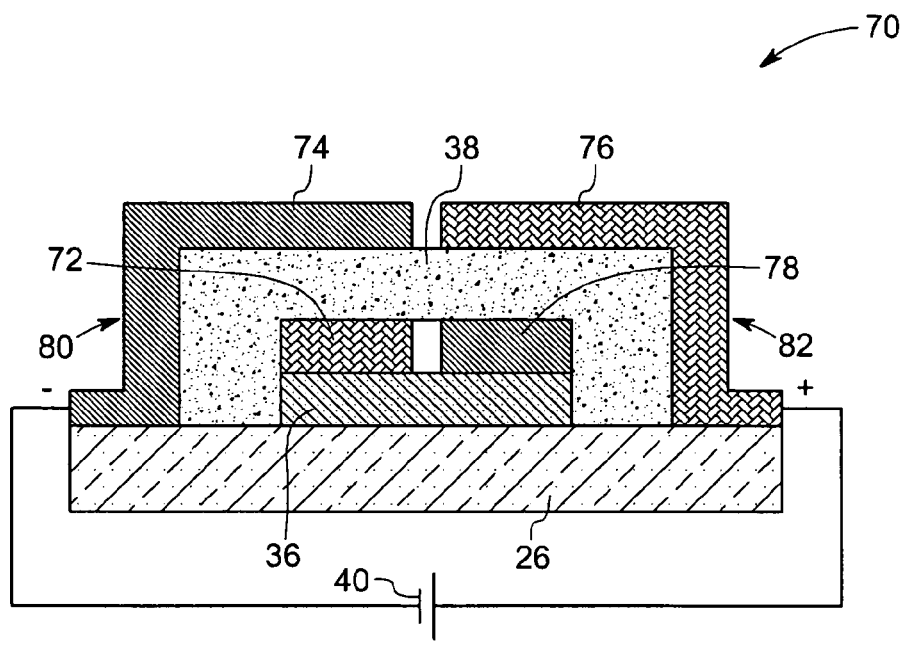
FIG. 4 illustrates a cross-sectional side view of yet another exemplary embodiment of a device, according to aspects of the present technique.

FIG. 4 illustrates another exemplary embodiment 70 of a device, according to aspects of the present technique. As explained with reference to FIG. 1, the illustrated embodiment 70 of FIG. 4 includes a first organic electronic device having an anode 72 and a cathode 74. Further, the illustrated embodiment 70 also includes a second organic electronic device having an anode 76 and a cathode 78. It may be noted that the first and second organic electronic devices that are disposed adjacent to each other may be coupled in series via the first interconnect layer 36. In other words, the series connection between the first and second organic electronic devices may be accomplished by coupling the anode 72 of the first organic electronic device with the cathode 78 of the second organic electronic device in series via the first interconnect layer 36.

In this embodiment, each of the cathodes 74 of the first organic electronic device and the anode 76 of the second organic electronic device may be extended to provide increased contact area. Consequently, the cathode 74 of the first organic electronic device may be extended to form a first tail 80. Similarly, the anode 76 of the second organic electronic device may be extended to form a second tail 82. The first and second tails 80, 82 may be advantageously configured to facilitate the encapsulation of the electronic device 70, thereby providing enhanced hermiticity. In addition, as previously mentioned, the electrodes that are coupled in series are disposed on the same side of the electro-active material 38.

Figure 5:
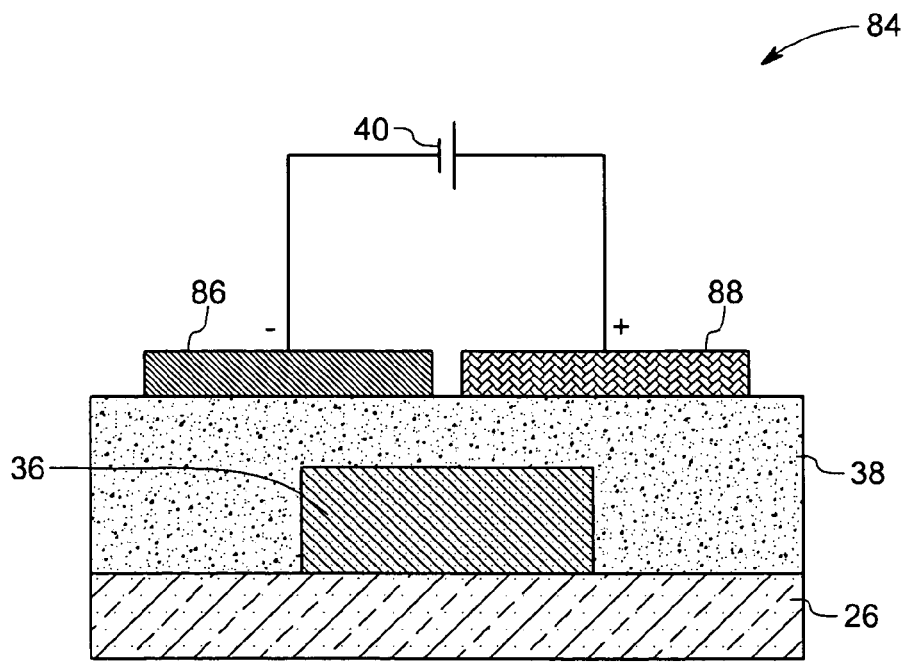
FIG. 5 illustrates a cross-sectional side view of another exemplary embodiment of a device, according to aspects of the present technique.

Turning now to FIG. 5, an exemplary embodiment 84 of a device is illustrated. In the illustrated embodiment 84, the first interconnect layer 36 may be configured to serve as an anode of a first organic electronic device and a cathode of a second organic electronic device in addition to facilitating a series coupling between adjacently disposed organic electronic devices. The first interconnect layer 36 facilitates a series connection coupling the anode of the first organic electronic device and the cathode of the second organic electronic device. Furthermore, reference numeral 86 may represent a cathode of the first organic electronic device and reference numeral 88 may represent an anode of the second organic electronic device.

In this embodiment, the first interconnect layer 36 may include a transparent material. Additionally, the first interconnect layer 36 may include an organic material. Further, the organic material of the first interconnect layer 36 may be doped such that regions representative of the anode of the first organic electronic device and the cathode of the second organic electronic device may be defined. Additionally, a position of the anode of the first organic electronic device and a position of the cathode of the second organic electronic device in the first interconnect layer 36 depends upon the position of the cathode 86 of the first organic electronic device and the anode 88 of the second organic electronic device. In other words, the first electrode of the first organic electronic device may be formed in a region of the first interconnect layer 36 such that the anode of the first organic electronic device is disposed substantially below the cathode 86 of the first organic electronic device. Similarly, the cathode of the second organic electronic device may be disposed in the first interconnect layer 36 such that the cathode of the second organic electronic device is disposed substantially below the anode 88 of the second organic electronic device.

Subsequently, upon operation of the device 84, the dopants in the organic material of the first interconnect layer 36 separate to form the anode of the first organic electronic device and the cathode of a second organic electronic device. In addition, as previously mentioned, the electrodes that are coupled in series are disposed on the same side of the electro-active material 38.

Figure 6:
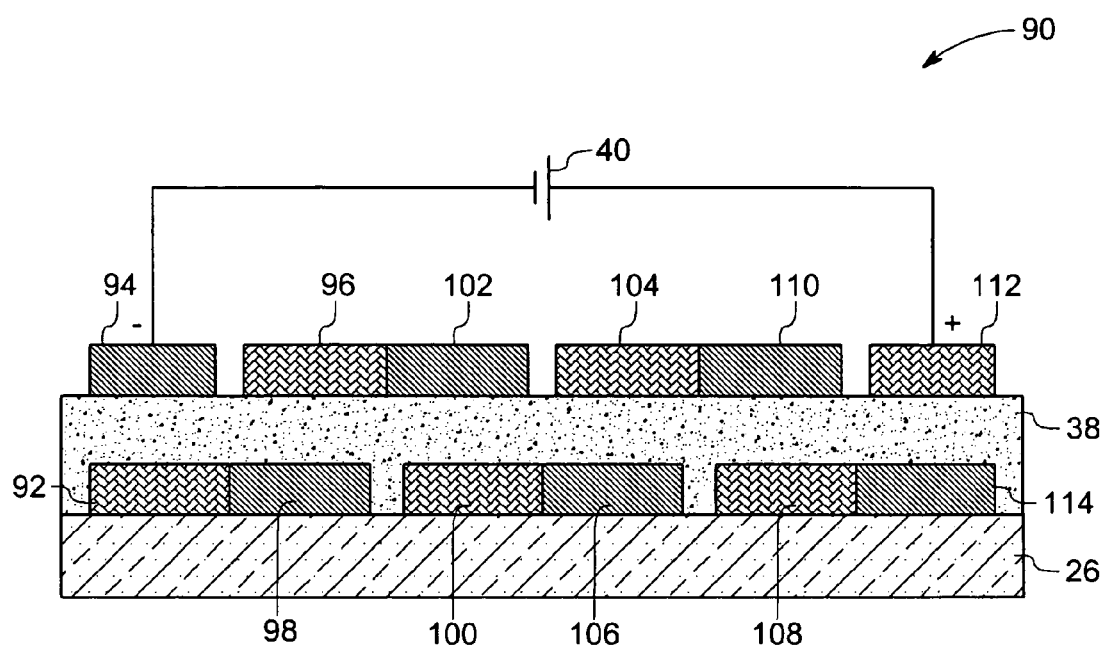
FIG. 6 illustrates a cross-sectional side view of yet another exemplary embodiment of a device, according to aspects of the present technique.

FIG. 6 illustrates an exemplary embodiment 90 of a device. The illustrated embodiment includes six organic electronic devices that are disposed adjacent to each other and are coupled in series. A first organic electronic device of the electronic device 90 may include an anode 92 and a cathode 94, and a second organic electronic device may include an anode 96 and a cathode 98. Similarly, the device 90 includes a third organic electronic device having an anode 100 and a cathode 102 and a fourth organic electronic device having an anode 104 and a cathode 106. Furthermore, the device 90 includes a fifth organic electronic device having an anode 108 and a cathode 110 and a sixth organic electronic device having an anode 112 and a cathode 114.

The anode 92 of the first organic electronic device may be electrically coupled in series with the cathode 98 of the second organic electronic device. In a similar fashion, the anode 100 of the third organic electronic device may be electrically coupled in series with the cathode 106 of the fourth organic electronic device. In addition, the anode 108 of the fifth organic electronic device may be electrically coupled in series with the cathode 114 of the sixth organic electronic device. Similarly, the anode 96 of the second organic electronic device may be electrically coupled in series with the cathode 102 of the third organic electronic device. Furthermore, the anode 104 of the fourth organic electronic device may be electrically coupled in series with the cathode 110 of the fifth organic electronic device. The electrodes that are not coupled in series, such as the cathode 94 of the first organic electronic device and the anode 112 of the sixth organic electronic device may be coupled to the leads of a power source 40.

In this embodiment, each of the anodes and cathodes of the six organic electronic devices is formed employing a first material, such as ITO. Additionally, in this embodiment, the adjacent pairs of anodes and cathodes of adjacently disposed organic electronic devices may serve as the interconnect layer. Further, the electro- active material 38 may include a blend of at least one electro-active material and a dopant. The dopant may include, for example, an ionic salt, a metal or an organic material.

Figure 7:
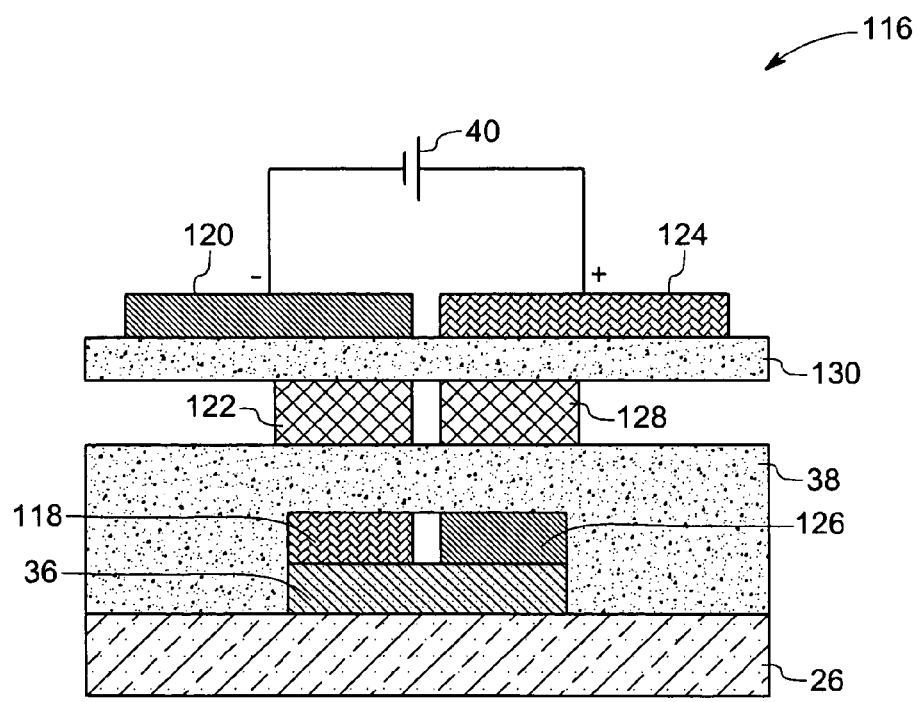
FIG. 7 illustrates a cross-sectional side view of another exemplary embodiment of a device, according to aspects of the present technique.

FIG. 7 illustrates an exemplary embodiment 116 of a device. In this embodiment, each of the plurality of organic electronic devices in the device 116 includes an anode, a cathode and an intermediate electrode disposed between the anode and cathode. For example, a first organic electronic device includes an anode 118, a cathode 120 and an intermediate electrode, such as a first intermediate electrode 122, disposed between the anode 118 and cathode 120 of the first organic electronic device. Similarly, a second organic electronic device includes an anode 124, a cathode 126 and an intermediate electrode, such as a second intermediate electrode 128, disposed between the anode 124 and cathode 126 of the second organic electronic device. In one embodiment, the first and second intermediate electrodes 122, 128, may include ITO. Alternatively, the first and second intermediate electrodes 122, 128, may include transparent carbon nanotubes.

The first and second organic electronic devices may be connected in series by electrically coupling the anode 118 of the first organic electronic device with the cathode 126 of the second organic electronic device via the first interconnect layer 36. As previously mentioned, the electrodes that are coupled in series are disposed on the same side of a electro-active material 38, thereby advantageously circumventing the need for vertical interconnect by forming vias.

It may be noted that a first electro-active material 38 may be disposed between the electrodes coupled in series, such as electrodes 118, 126, and the first and second intermediate electrodes 122, 128. Furthermore, a second electro-active material 130 may be disposed between the first and second intermediate electrodes 122, 128, and the electrodes that are not coupled in series, such as electrodes 120, 124. In one embodiment, the first and second electro-active materials 36, 130 may be formed employing a first material. Alternatively, the second electro-active layer 130 may be formed employing a second material that is different from the first material.

In accordance with aspects of the present technique, the first and second intermediate electrodes 122, 128 enable the first and second organic electronic devices to be used as two organic electronic devices coupled in a vertical direction. In one embodiment, the intermediate electrodes 122, 128 may be configured to serve as additional anode and cathode of each of the plurality of organic electronic devices. In other words, the first intermediate electrode 122 may be configured to serve as an intermediate anode and cathode by suitably doping areas of the first intermediate electrode 122. In a presently contemplated configuration, the first organic electronic device includes an anode 118 and a cathode 120. The first intermediate electrode 122 may be formed employing a first material. In this embodiment, a bottom half of the first intermediate electrode 122 may be doped to form a first intermediate cathode disposed adjacent to the anode 118 of the first organic electronic device. Further, the top half of the first intermediate electrode 122 may be doped to form a first intermediate anode disposed adjacent to the cathode 120 of the first organic electronic device.

Alternatively, the first intermediate anode and cathode may be formed in the first intermediate electrode 122 by employing first and second materials respectively. In one embodiment, the first material employed to form the first intermediate anode may include ITO. In addition, the second material employed to form the first intermediate anode may include a coated reactive metal. Similarly, the second intermediate electrode 128 may be configured to enable the second organic electronic device to be used as two organic electronic devices coupled in a vertical direction. The exemplary embodiment 116 illustrated in FIG. 7 advantageously facilitates the device 116 to draw lower current thereby enabling a relatively longer life and greater stability.

In the embodiments of the devices illustrated in FIGS. 2-7, each of the plurality of organic electronic devices is depicted as having respective anodes and cathodes. Alternatively, in accordance with aspects of the present technique, each of the plurality of organic electronic devices may include respective hole injection layers and electron injection layers.

The various embodiments of the device and the method of fabricating the device described hereinabove enable cost-effective fabrication of devices. Further, employing the method of fabrication described hereinabove, series electrical interconnection between the plurality of adjacently disposed organic electronic devices that advantageously circumvents the limitations of current techniques may be achieved. The method of fabricating the device advantageously results in a simplified process, thereby substantially reducing the possibilities of creating defects.

Further, the device may be configured to provide desirable fault tolerance against electrical shorts. Also, the various embodiments of the device facilitate desirable tolerance against misalignment of the plurality of organic electronic devices. Additionally, the various embodiments of the devices described hereinabove may advantageously be operated at a substantially lower current to achieve a desirable brightness of the device.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device comprising:
   a plurality of organic electronic diodes disposed on a substrate, wherein each of the plurality of organic electronic diodes comprises a first electrode and a second electrode, and wherein each of the plurality of organic electronic diodes is electrically connected in series;
   an electro-active material disposed between the first and second electrodes of each of the plurality of organic electronic diodes; and
   an interconnect layer disposed on the substrate, wherein the interconnect layer is configured to electrically connect each of the plurality of organic electronic diodes in series via a series connection connecting one of the first electrode and second electrode of each of the plurality of organic electronic diodes to the other of the first electrode and second electrode of an adjacent organic electronic diode of the plurality of organic electronic diodes, wherein the series connection is achieved in a plane substantially parallel to the plane of the substrate,
   wherein the first electrode includes a hole injection layer and the second electrode includes an electron injection layer;
   wherein the first and second electrodes are each patterned; the electro-active material forms an electro-active layer extending continuously between and within the plurality of organic electronic diodes; and the series connection does not cross the electro-active layer.

2. The device of claim 1, wherein the electro-active material comprises a polymer.

3. The device of claim 1, wherein each of the first electrodes is an anode and each of the second electrodes is a cathode.

4. The device of claim 3, wherein each of the first electrodes comprises a first conducting material that is transparent to light emitted, absorbed, modulated, or combinations thereof by the device.

5. The device of claim 4, wherein the first conducting material comprises indium tin oxide.

6. The device of claim 1, wherein each of the second electrodes comprises a second conducting material that is transparent to light emitted, absorbed, modulated, or combinations thereof by the device.

7. The device of claim 6, wherein the second conducting material comprises a transparent conductor.

8. The device of claim 6, wherein the second conducting material comprises one of a transparent conductor or a metal.

9. The device of claim 1, wherein the electrodes that directly coupled in series via the interconnect layer are at a potential different from potentials of the electrodes they are not directly coupled in series, when the device is operating.

10. The device of claim 1, wherein each of the organic electronic diodes comprises one of an organic light emitting device, an organic photovoltaic cell, an organic electrochromic device, an organic sensor, or combinations thereof.

11. The device of claim 1, wherein the substrate comprises a flexible substrate.

12. The device of claim 1, wherein the interconnect layer comprises one of a conductive ceramic, a metal, a conductive organic material or combinations thereof.

13. The device of claim 1, wherein the electro-active material comprises one of an organic light-emitting material, an organic light-absorbing material, and an organic electrochromophore or combinations thereof.

14. The device of claim 1, wherein the first and second electrode comprise different materials.

* * * * *